United States Patent
Schmökel

(10) Patent No.: US 6,614,248 B2
(45) Date of Patent: Sep. 2, 2003

(54) TESTER APPARATUS FOR ELECTRONIC COMPONENTS

(75) Inventor: Hartmut Schmökel, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/186,659

(22) Filed: Jul. 1, 2002

(65) Prior Publication Data

US 2003/0001602 A1 Jan. 2, 2003

(30) Foreign Application Priority Data

Jun. 29, 2001 (DE) .......................... 101 31 711

(51) Int. Cl.$^7$ ................................ G01R 31/02
(52) U.S. Cl. .................... 324/755; 324/158.1
(58) Field of Search ........................ 324/158.1, 755, 324/754, 765, 758, 757; 439/66; 714/733, 710, 718

(56) References Cited

U.S. PATENT DOCUMENTS

| 5,471,151 | A |   | 11/1995 | DiFrancesco |
| 5,477,160 | A | * | 12/1995 | Love ........................... 324/755 |
| 6,489,791 | B1 | * | 12/2002 | Tsujii .......................... 324/755 |
| 6,535,007 | B2 | * | 3/2003 | Haas et al. .................. 324/755 |

FOREIGN PATENT DOCUMENTS

| DE | 3909284 A1 | 9/1990 |
| DE | 4122621 A1 | 1/1992 |

* cited by examiner

*Primary Examiner*—Kamand Cuneo
*Assistant Examiner*—Jimmy Nguyen
(74) *Attorney, Agent, or Firm*—Laurence A. Greenberg; Werner H. Stemer; Gregory L. Mayback

(57) ABSTRACT

A tester apparatus for electronic components has a tester unit and one or more first contactor apparatus next to one another for making contact with the electronic components. A first component carrier carries components in a first plane, and it can be positioned by a supply device such that the first contactor apparatus can contact the components on the first component carrier. A second component carrier is disposed to carry the components in a second plane. One or more second contactor apparatus contact the electronic components in a second plane for connection to the tester unit. The first and second component carriers are disposed such that, when the first contactor apparatus makes contact with the components on the first component carrier, contact is made with the components on the second component carrier essentially simultaneously using the second contactor apparatus.

5 Claims, 1 Drawing Sheet

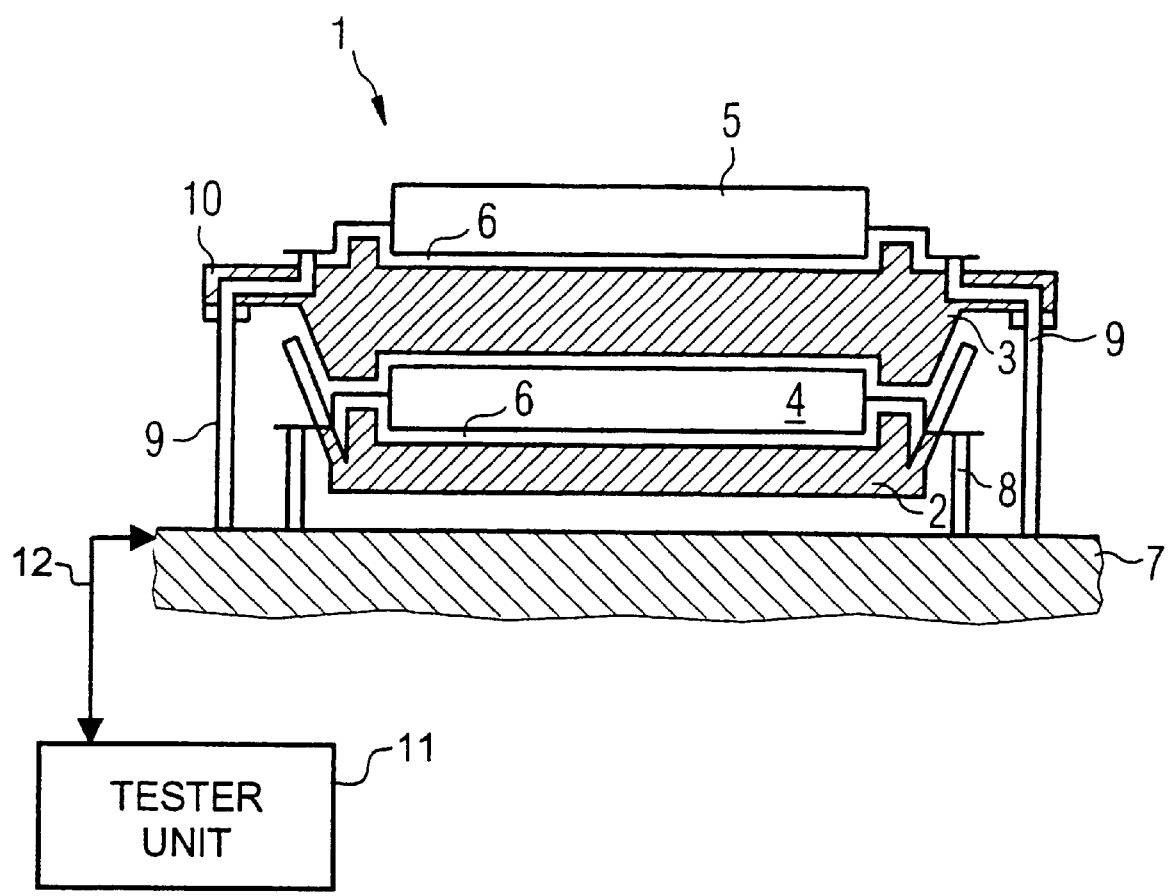

TESTER APPARATUS FOR ELECTRONIC COMPONENTS

BACKGROUND OF THE INVENTION

1. Field of the Invention

The invention lies in the field of electronic component and electronic component manufacture.

For the purpose of automatically testing electronic components, not only the tester unit but also supply devices ("handlers") are required which allow the components to be supplied automatically to the test supports. The test supports are on contactor apparatus ("HiFixes") which are used to produce an electrical connection to the tester unit. The electronic components are transported by means of the supply device in component carriers or chip carriers ("test trays") which hold the electronic components in a similar manner to a tray. The component carriers ensure that the components are aligned above the contactor apparatus, so that it is possible for clean, correct and perfect contact to be made with the components on the contactor apparatus.

Since, particularly with larger and larger scale integration densities, testing a component is taking longer and longer, this accounts for an increasing proportion of the total manufacturing costs. It is therefore necessary to take measures to reduce the test time and hence to reduce the test costs substantially.

The test costs can firstly be reduced by reducing the test time for the electronic components. However, this would reduce the likelihood of finding a fault, which means that a larger number of faulty electronic components would be delivered to the customer.

Secondly, it is possible to reduce the test time by increasing the number of electronic components tested simultaneously in a tester apparatus. Normally, the parallelism for testing on conventional tester apparatus is fundamentally limited by the number of available tester channels and by the maximum number of test supports available, which is determined by the geometric arrangement of the electronic components.

Increasing the number of tester channels requires a great deal of complexity, and it can normally be altered only by the manufacturer of the tester apparatus. However, the geometry-related number of test supports frequently restricts the number of tester channels used to below that resulting from the parallelism associated with the tester apparatus. Thus, the number of tester channels can normally be increased by modifying the supply device. This is a comparatively simple matter, since only slight modifications are required.

Such a measure is implemented, by way of example, by virtue of the number of contactor apparatus arranged next to one another having been increased either in the x direction or in the y direction. This is possible only within the scope of the geometric dimensions on the component carrier or on the HiFix, however. A further increase in the geometric dimensions would result in high development and manufacturing costs. In addition, if the size of the tester apparatus is unaltered, any impairment of the test performance would be worsened by longer supply lines to the contactor apparatus.

SUMMARY OF THE INVENTION

It is accordingly an object of the invention to provide a tester apparatus for testing electronic components, which overcomes the above-mentioned disadvantages of the heretofore-known devices and methods of this general type and which provides for a tester apparatus that affords a simple way of reducing the test time for electronic components.

With the foregoing and other objects in view there is provided, in accordance with the invention, a tester apparatus for electronic components, comprising:

a tester unit;

at least one first contactor apparatus connected to the tester unit and configured for making contact with an electronic component;

a first component carrier for holding a component in a first plane, the first component carrier being positionable by way of a supply device for making contact between the components on the first component carrier and the first contactor apparatus;

a second component carrier for holding a component in a second plane, the second component carrier being positionable by way of the supply device;

at least one second contactor apparatus connected to the tester unit and configured for making contact with the electronic component in the second plane for connecting the electronic component to the tester unit;

wherein the first and second component carriers are disposed with respect to one another such that, when contact is made between the first contactor apparatus and the component on the first component carrier, substantially simultaneous contact is made between the second contactor apparatus and the component on the second component carrier.

In accordance with an added feature of the invention, the first contactor apparatus is one of a plurality of first contactor apparatus disposed adjacent one another for contacting electronic components carried on the first plane.

In other words, the invention provides a tester apparatus for electronic components, having a tester unit and having first contactor apparatus arranged next to one another. The contactor apparatus are provided for the purpose of making contact with the electronic components for connection to the tester unit. A first component carrier is provided, on which the components can be positioned in a first plane. The first component carrier can be positioned by means of a supply device in order to make contact with the components on the first component carrier using the first contactor apparatus. The invention provides a second component carrier, on which the components can be positioned in a second plane. The second component carrier can likewise be positioned by means of the supply device. In addition, second contactor apparatus are provided in a second plane in order to make contact with electronic components for connection to the tester unit. The arrangement of the first and second component carriers with respect to one another is such that, when contact is made with the components on the first component carrier using the first contactor apparatus, contact is made with the components on the second component carrier essentially simultaneously using the second contactor apparatus.

By arranging the electronic components to be tested on two component carriers which, when supplied by means of the supply device, are respectively fitted onto the corresponding contactor apparatus essentially simultaneously, it is possible to keep the arrangement of the first and second component carriers in the tester apparatus flexible. In particular, it is possible to arrange the component carriers so as to be offset from one another, i.e. to offset them from one another in terms of the plane wherein the components are arranged. In this way, the components to be tested can be tested simultaneously in a tester apparatus without the size or the external shape of the electronic components restricting the number of components which can be tested simultaneously.

In accordance with an additional feature of the invention, the first and second planes defined by the first and second component carriers are arranged above one another. That is, provision is made for the first and second planes for the first and second component carriers to be arranged above one another. Since, in conventional tester apparatus, the size of the HiFixes with the contactor apparatus is normally limited in the x-direction and in the y-direction, provision can now be made for the components which are to be tested to be arranged above one another, with contact being made therewith simultaneously when they are fitted onto the respective contactor apparatus. To this end, in particular, first and second contactor apparatus are provided which are preferably likewise arranged above one another.

Provision can also be made for the first and second contactor apparatus to have a respective contact plate on which there are contacts in order to make contact with the components on the first and second component carriers. The contact plate for the first contactor apparatus and the contact plate for the second contactor apparatus are arranged essentially above one another. In this way, the contact plates for the contactor apparatus can be arranged in a space-saving manner with respect to one another, so that the latter can also be incorporated in conventional tester apparatus.

In accordance with a concomitant feature of the invention, essentially all of the first contactor apparatus and all of the second contactor apparatus are connected to the tester unit for testing each of the respective components connected thereto.

Other features which are considered as characteristic for the invention are set forth in the appended claims.

Although the invention is illustrated and described herein as embodied in a tester apparatus for electronic components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE is a vertical section taken through a tester apparatus according to the invention.

DESCRIPTION OF THE PREFERRED EMBODIMENTS

The single FIGURE shows a contactor system 1 for a tester apparatus which is connected to a non-illustrated testing unit. The contactor system 1 has a first component carrier 2 and a second component carrier 3. The first and second component carriers 3 are connected to a supply device which moves the component carriers 2, 3 for the purpose of making contact. The first component carrier 2 has a first component 4 arranged on it, and the second component carrier 3 has a second component 5 arranged on it. To this end, the first component carrier 2 and the second component carrier 3 have cavities 6 which contain the electronic components or chips 4, 5 and thus protect them from lateral displacement.

A test support 7 is provided on which a first contactor apparatus 8 and a second contactor apparatus 9 are disposed. The contactor apparatus 8, 9 have contacts which are arranged such that they can be connected to the terminal connections on the electronic components 4, 5. The contacts on the contactor apparatus 8, 9 are connected to a tester unit 11 via the test support 7 and tester lines 12 for the purpose of testing the electronic components 4, 5 by interrogation or by applying test signals.

The second contactor apparatus 9 has a contact plate 10 which is offset vertically with respect to the test support 7 and thus forms another plane for making contact with the component 5 on the second component carrier 3.

In conventional tester apparatus, there is normally no way of increasing the parallelism, which is restricted to below the number of possible tester channels on account of the size and shape of the electronic components to be tested, by increasing the surface area on which the contactor apparatus 8, 9 are arranged. It is thus possible to increase the parallelism further only by providing contactor apparatus 8, 9 in a vertical direction. If component carriers 2, 3 of the same type are used, it is thus possible to double, triple or quadruple the parallelism by arranging a plurality of component carriers above one another.

Conventional tester apparatus can be modified in order to provide a tester apparatus in accordance with the invention. To this end, the supply device needs to be provided with two or more component carriers 8, 9, which are preferably arranged above one another. The supply device then moves the two component carriers 8, 9 to the same extent, so that contact is made therewith simultaneously during a procedure fitting them onto contacts.

This also requires contactor apparatus 8, 9 to be provided such that contact is made essentially simultaneously when the components 4, 5 are fitted onto the contactor apparatus 8, 9 by means of a fitting motion of the component carriers 2, 3.

The features of the invention which have been disclosed in the description above, in the claims and in the drawing can be significant both individually and in any desired combination for the purpose of implementing the invention in its various embodiments.

I claim:

1. A tester apparatus for electronic components, comprising:

a tester unit;

at least one first contactor apparatus connected to said tester unit and configured for making contact with an electronic component;

a first component carrier for holding a component in a first plane, said first component carrier being positionable by way of a supply device for making contact between the components on said first component carrier and said first contactor apparatus;

a second component carrier for holding a component in a second plane, said second component carrier being positionable by way of the supply device;

at least one second contactor apparatus connected to said tester unit and configured for making contact with the electronic component in the second plane for connecting the electronic component to said tester unit;

wherein said first and second component carriers are disposed with respect to one another such that, when contact is made between said first contactor apparatus and the component on said first component carrier, substantially simultaneous contact is made between said second contactor apparatus and the component on said second component carrier.

2. The tester apparatus according to claim 1, wherein said first contactor apparatus is one of a plurality of first contactor apparatus disposed adjacent one another for contacting electronic components carried on the first plane.

3. The tester apparatus according to claim 1, wherein said first and second planes defined by said first and second component carriers are arranged above one another.

4. The tester apparatus according to claim 1, wherein said first and second contactor apparatus each comprises at least one contact plate formed with contacts for making contact with the components on the respective said first and second component carriers; and said contact plate for said first contactor apparatus and said contact plate for said second contactor apparatus are disposed substantially above one another.

5. The tester apparatus according to claim 1, wherein said first contactor apparatus is one of a plurality of first contactor apparatus disposed adjacent one another for contacting electronic components carried on the first plane, said second contactor apparatus is one of a plurality of second contactor apparatus disposed adjacent one another for contacting electronic components carried on the second plane, and substantially all of said first contactor apparatus and all of said second contactor apparatus are connected to said tester unit for testing each of the respective components connected thereto.

* * * * *